United States Patent
Everton et al.

(10) Patent No.: US 7,071,781 B2
(45) Date of Patent: Jul. 4, 2006

(54) HIGH SPEED, HIGH RESOLUTION AMPLIFIER TOPOLOGY

(75) Inventors: Seth L. Everton, Torrance, CA (US); Lloyd F. Linder, Agoura Hills, CA (US); Michael H. Liou, Northridge, CA (US); Tom A. Spargo, Hermosa Beach, CA (US); Kelvin T. Tran, Torrance, CA (US)

(73) Assignee: TelASIC Communications, Inc., El Segundo, CA (US)

( * ) Notice: Subject to any disclaimer, the term of this patent is extended or adjusted under 35 U.S.C. 154(b) by 94 days.

(21) Appl. No.: 10/740,172

(22) Filed: Dec. 18, 2003

(65) Prior Publication Data

US 2005/0035821 A1    Feb. 17, 2005

Related U.S. Application Data

(60) Provisional application No. 60/495,573, filed on Aug. 14, 2003.

(51) Int. Cl.
    *H03F 3/45*  (2006.01)
(52) U.S. Cl. .......................... 330/261; 330/260; 330/297
(58) Field of Classification Search ................ 330/261, 330/260, 297
    See application file for complete search history.

(56) References Cited

U.S. PATENT DOCUMENTS

| | | | | |
|---|---|---|---|---|
| 3,602,830 | A | * | 8/1971 | Hurd, III ..................... 330/277 |
| 4,258,406 | A | * | 3/1981 | Seki ............................ 361/79 |
| 4,366,432 | A | * | 12/1982 | Noro ........................... 323/224 |
| 4,445,009 | A | * | 4/1984 | Suzuki et al. ................ 330/297 |
| 5,909,145 | A | * | 6/1999 | Zimmerman ................ 330/128 |
| 6,191,653 | B1 | * | 2/2001 | Camp et al. ................. 330/129 |
| 6,850,118 | B1 | * | 2/2005 | Hanafusa et al. ........... 330/297 |
| 6,888,409 | B1 | * | 5/2005 | Taylor ......................... 330/297 |

* cited by examiner

*Primary Examiner*—Patricia Nguyen
(74) *Attorney, Agent, or Firm*—Morrison & Foerster LLP

(57) ABSTRACT

An amplifier. The novel amplifier includes a first circuit for receiving and amplifying an input signal and outputting an output signal, and a second circuit for supplying power to the first circuit, wherein the power supplied varies in accordance with variations in the output signal. The second circuit includes a bootstrapping circuit adapted to regulate the voltages across any transistors in the signal path such that the voltages remain constant. In an illustrative embodiment, the second circuit bootstraps the voltages across a PMOS current source that acts as the load to an input stage, as well as a Darlington pair in an output stage of the amplifier.

38 Claims, 3 Drawing Sheets

HIGH SPEED, HIGH RESOLUTION AMPLIFIER TOPOLOGY

CROSS-REFERENCE TO RELATED APPLICATIONS

This application claims the benefit of U.S. Provisional Application No. 60/495,573, filed Aug. 14, 2003, the disclosure of which is hereby incorporated by reference.

BACKGROUND OF THE INVENTION

1. Field of the Invention

The present invention relates to electronics. More specifically, the present invention relates to amplifiers.

2. Description of the Related Art

High dynamic range, low distortion, wideband amplifiers are used in many applications such as pulse mode applications, spectrally pure waveform generation, RF (radio frequency) and IF (intermediate frequency) amplifiers, video processing circuits, and as residue amplifiers for subranging analog to digital converters. These circuits find application in a myriad of fields including communications, high quality audio and video, instrumentation, electronic warfare, radar and sonar.

In these applications, a closed loop amplifier is required to provide accurate, stable, voltage gain. These amplifiers must be linear to better than 0.001% for signal frequencies from DC to IF and higher as the transition frequency $f_T$ increases with improvements in processing technologies. Prior art amplifiers do not meet this requirement for high speed, high resolution applications.

A closed loop amplifier is typically comprised of an operational amplifier (op amp) and two resistors connected in a feedback configuration. The closed loop voltage gain G of a closed loop amplifier is given by A/(1+AB), where A is the gain (or open loop gain) of the op amp and B is the feedback ratio of the circuit. For many applications, A can be considered constant since, for large A and small B, small changes in A are attenuated by the loop gain, AB. However, when extremely high accuracies are required, changes in A cannot be ignored. In particular, if A changes as a function of the input, the output will no longer be a linear function of the input and intermodulation distortions will occur.

Unfortunately, the gain A of a conventional op amp will vary as a function of the input. This is due primarily to the Early effect (in bipolar transistors) and channel length modulation (in field-effect transistors, or FETs) in the transistors in the signal path. A typical op amp includes a PMOS current source, which sets the load impedance $r_O$ of the gain stage. The voltage across the current source, however, changes as a function of the input voltage. This causes a change in the output impedance $r_O$ of the current source due to an effect called channel length modulation. This effect is caused by the transistor's channel length changing as its drain to source voltage changes. This length change in effect changes the output impedance of the FET. Therefore, the output impedance $r_O$ of the current source changes as a function of the input voltage. Since $r_O$ primarily sets the gain A of the op amp, any variations of $r_O$ will vary A. Thus, the gain A varies as a function of the input voltage. Channel length modulation can easily change the gain A of the op amp by 1%.

In a closed loop amplifier, an error in A will be reduced by the loop gain AB. At low frequencies where the loop gain is high (assume $10^3$), a 1% change in A would change the output only approximately 0.001%, which is acceptable. However, at higher frequencies where the gain drops off and the loop gain might only be about 10, a 1% change will result in a 0.8% change in the output. This cannot be tolerated. The use of this amplifier is therefore restricted to a bandwidth that allows sufficient loop gain to reduce the errors due to channel length modulation. Clearly channel length modulation has limited both the bandwidth and the dynamic range of the amplifier.

A similar problem occurs in the output stage of the op amp, which typically includes a Darlington pair. The voltages across the Darlington transistors also vary as a function of the input voltage. Variations in the collector to emitter voltage of a bipolar transistor results in variations in the effective base width of the transistor, causing the transistor's output impedance to become finite. This is known as the Early effect, and it causes a distortion in the gain A of the op amp.

The error due to the Early effect is inside the loop, so for low frequencies it is negligible but for high frequencies where the loop gain approaches 10, this error would add significantly to the distortion products of the amplifier. More limiting to the amplifier's performance is the collector to base capacitance $C_{CB}$ of both Darlington pair transistors. Since their collectors are typically tied to the power supply, the capacitances must charge and discharge as the input voltage changes. This will impact the settling time and distortion of the amplifier due to the additional charging and discharging currents and the settling of those currents the capacitances cause.

Hence, there is a need in the art for an improved amplifier offering faster speed and larger dynamic range than prior art approaches.

SUMMARY OF THE INVENTION

The need in the art is addressed by the amplifier of the present invention. The novel amplifier includes a first circuit for receiving and amplifying an input signal and outputting an output signal, and a second circuit for supplying power to the first circuit, wherein the power supplied varies in accordance with variations in the output signal. The second circuit includes a bootstrapping circuit adapted to regulate the voltages across any transistors in the signal path such that the voltages remain constant. In an illustrative embodiment, the second circuit bootstraps the voltages across a PMOS current source that acts as the load to an input stage, as well as a Darlington pair in an output stage of the amplifier.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
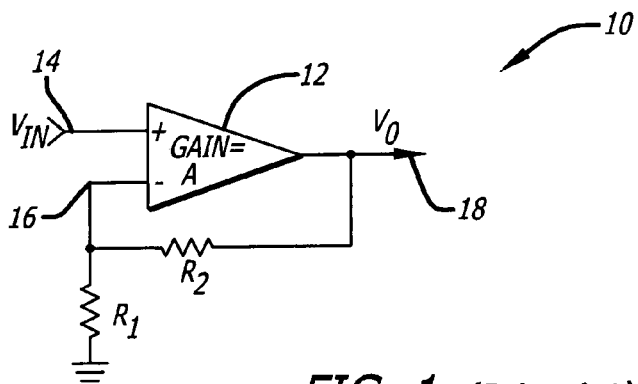
FIG. 1 is a simplified schematic of a conventional non-inverting feedback amplifier.

FIG. 1 is a simplified schematic of a conventional non-inverting feedback amplifier 10. The amplifier 10 includes an op amp 12 having gain A, and two resistors R1 and R2 connected in a feedback configuration. The resistor R2 is connected between the negative input terminal 16 and the output terminal 18 of the op amp 12, and the resistor R1 is connected between the negative input terminal 16 and ground. An input voltage $V_{IN}$ is applied to the positive input terminal 14 of the op amp 12, and an output voltage $V_O$ is output at the output terminal 18 of the op amp 12.

It is well known that the output voltage $V_O$ is given by:

$$V_O = V_{IN}\left(\frac{A}{1+AB}\right), \quad [1]$$

where $B=R1/(R1+R2)$ is the feedback ratio of the circuit and AB is the loop gain.

The closed loop voltage gain G is therefore given by:

$$G = \frac{V_O}{V_{IN}} = \frac{A}{1+AB}. \quad [2]$$

For many applications, A can be considered constant since, for large A and small B, small changes in A are attenuated by the loop gain, AB. However, when extremely high accuracies are required, changes in A cannot be ignored. In particular, if A changes as a function of $V_{IN}$, the output $V_O$ will no longer be a linear function of $V_{IN}$ and intermodulation distortions will occur.

Figure 2:
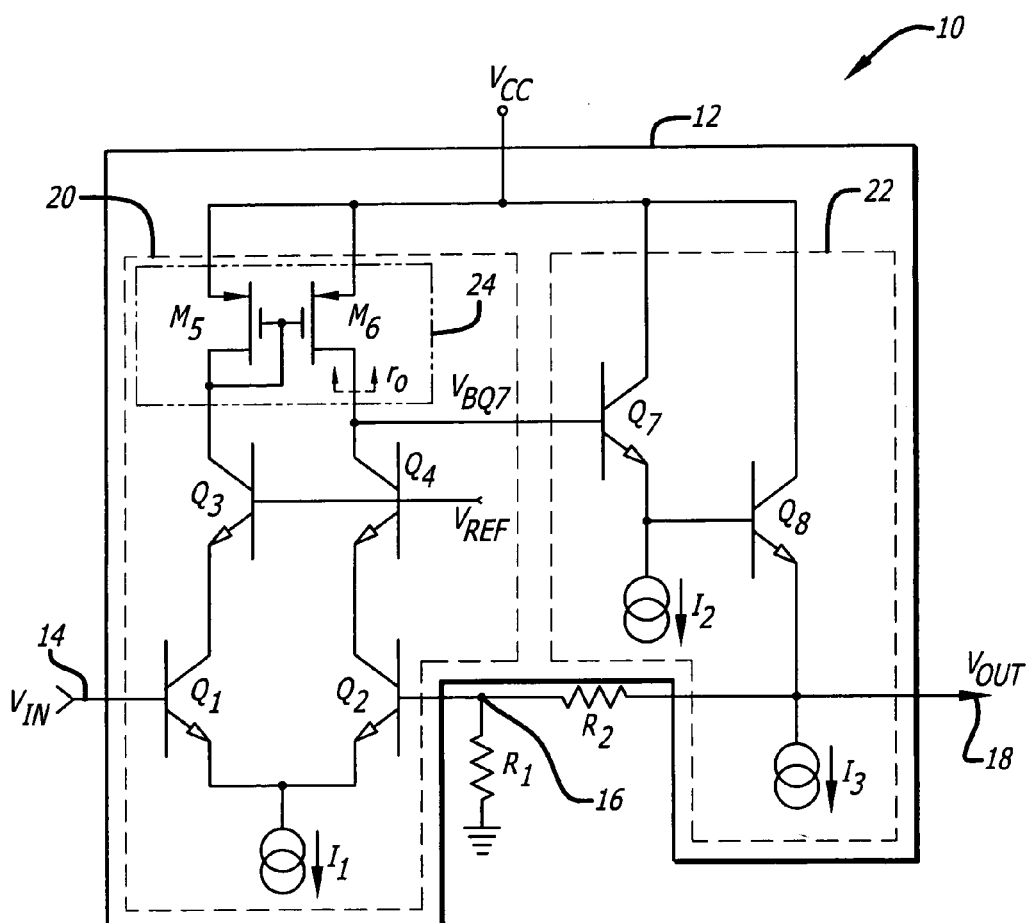
FIG. 2 is a simplified schematic of a conventional non-inverting closed loop amplifier including the internal components of a typical high speed op amp.

FIG. 2 is a simplified schematic of a conventional non-inverting closed loop amplifier 10 including the internal components of a typical high speed op amp 12. The op amp 12 includes an input stage 20 and an output stage 22. The input stage 20 includes a differential pair Q1 and Q2 having emitters connected in common to a current source I1. The bases of Q1 and Q2 are connected to the positive input terminal 14 and the negative input terminal 16, respectively. The collectors of Q1 and Q2 are coupled to the emitters of cascode transistors Q3 and Q4, respectively. The bases of Q3 and Q4 are connected in common to a reference voltage $V_{REF}$. The collectors of Q3 and Q4 are connected to a load circuit 24 comprised of PMOS transistors M5 and M6 connected in a current mirror configuration. The drains of M5 and M6 are connected to the collectors of Q3 and Q4, respectively, and the gates of M5 and M6 are connected in common to the drain of M5. The sources of M5 and M6 are connected to a DC power supply $V_{CC}$. The drain of M6 is coupled to the output stage 22.

The output stage 22 includes a Darlington pair Q7 and Q8. The base of Q7 is coupled to the drain of M6, and the emitter of Q7 is coupled to a current source I2. The base of Q8 is coupled to the emitter of Q7, and the emitter of Q8 is coupled to a current source I3. The collectors of Q7 and Q8 are connected to the power supply $V_{CC}$. The output terminal 18 is connected to the emitter of Q8.

For illustrative purposes, assume that the gain G of the amplifier 10 is approximately G=10. Further assume an output range of +/−2 V. Calculating the voltage $V_{BQ7}$ at the base of Q7 by inspection gives $V_{BQ7}=V_{OUT}+1.6$ V (where the sum of the base to emitter voltages $V_{BE}$ of Q7 and Q8 is 1.6 V). Since $V_{OUT}=10V_{IN}$, $V_{BQ7}=10V_{IN}+1.6$ V. $V_{BQ7}$ is therefore a function of $V_{IN}$.

There are two problem areas with this implementation. First, the voltage across M6, $V_{SDM6}$ is equal to $V_{CC}-V_{BQ7}$. $V_{BQ7}$, however, is a function of $V_{IN}$, and will vary +/−2 V, or a change of 4 V, over the output range of the amplifier. This causes a change in the output impedance $r_O$ of M6 due to channel length modulation. This effect is caused by the FET's channel length changing as the source to drain voltage $V_{SD}$ changes. This length change in effect changes the output impedance of the FET. So the output impedance $r_O$ of M6 changes as a function of the input voltage. Since $r_O$ primarily sets the gain A of the op amp 12, any variations of $r_O$ will vary the gain A. Channel length modulation can easily change the gain A of the op amp by 1%.

Since $V_O=V_{IN}[A/(1+AB)]$, an error in A will be reduced by the loop gain AB. So, at low frequencies where the loop gain is high (assume $10^3$) a 1% change in A would change the output by only approximately 0.001%, which is acceptable. However, at higher frequencies where the gain drops off and the loop gain might only be 10, a 1% change will result in a 0.8% change in the output. This cannot be tolerated. The use of this amplifier is therefore restricted to a bandwidth that allows sufficient loop gain to reduce the errors due to channel length modulation. Clearly channel length modulation has limited both the bandwidth and the dynamic range of the amplifier.

The second problem with this implementation is the distortion caused by the Early effect experienced by the output Darlington pair, Q7 and Q8. The voltage across Q7, $V_{CEQ7}$ equals $V_{CC}-V_{BQ8}$, where the voltage at the base of Q8, $V_{BQ8}$, is approximately $V_{OUT}+0.8$ V. Therefore, $V_{CEQ7}$ will change as $V_{IN}$ changes since $V_{OUT}$ is approximately 10 $V_{IN}$. Similarly, the voltage across Q8, $V_{CEQ8}$, will also change as $V_{IN}$ changes, since $V_{CEQ8}=V_{CC}-V_{OUT}$.

The open loop output error due to the Early effect can be calculated by letting $R_2$ be infinite and looking at Q8. Since $I_{CQ8}+I_{BQ8}=I_3$, where $I_{CQ8}$ and $I_{BQ8}$ are the collector current and base current of Q8, respectively, the change in $I_{BQ8}$ is given by:

$$\Delta I_{BQ8}=\Delta I_3-\Delta I_{CQ8}=-\Delta I_{CQ8} \quad [3]$$

since $I_3$ is a constant.

The collector current $I_C$ of a transistor and the change in collector current $\Delta I_C$ are given by:

$$I_C = I_O\left(1+\frac{V_{CE}}{V_{AF}}\right) \quad [4]$$

$$\Delta I_C = \left(\frac{I_O}{V_{AF}}\right)\Delta V_{CE} \quad [5]$$

where $V_{CE}$ is the collector to emitter voltage, $\Delta V_{CE}$ is the change in $V_{CE}$, $I_O$ is the emitter current, and $V_{AF}$ is the Early voltage, which is a parameter of the bipolar transistor.

Substituting Eqn. 5 into Eqn. 3 gives:

$$\Delta I_{BQ8} = -\left(\frac{I_O}{V_{AF}}\right)\Delta V_{CEQ8}. \quad [6]$$

Let $I_O=I_3=5$ mA, $V_{AF}=100$ V, the change in the output voltage $\Delta V_{OUT}=4$ V and therefore $\Delta V_{CE}=4$ V. Then the change in the base current of Q8 is $\Delta I_{BQ8}=0.2$ mA, and the change in the base voltage of Q8 is $\Delta V_{BQ8}=\Delta I_{BQ8}/g_m=5$ mV, where $g_m$ is the transconductance of the transistor and equals 40 mA/V. Doing a similar analysis for $\Delta V_{BQ7}$, but letting $I_O=I_2=1$ mA, results in the change in the base voltage of Q7 being $\Delta V_{BQ7}=1$ mV.

Thus, for this numerical example, the base voltage of Q7 will vary by 1 mV, and the base voltage of Q8 will vary by 5 mV. Since they are in series, they add to a total Early effect error of 6 mV. This is inside the loop, so for low frequencies it is negligible but for high frequencies where the loop gain approaches 10, this error will add significantly to the distortion products of the amplifier.

More limiting to the circuit's performance is the capacitance from collector to base $C_{CB}$ of both Q7 and Q8. Since the collectors are tied to $V_{CC}$, the $C_{CB}$ capacitances must charge and discharge as $V_{IN}$ changes. This will impact the settling time and distortion of the amplifier due to the additional charging and discharging currents, and the settling of those currents that the $C_{CB}$ capacitances cause.

The present invention significantly reduces the variation of the open loop gain A as a function of $V_{IN}$ by virtually eliminating the channel length modulation experienced in sub-micron CMOS devices used in the signal path, allowing broader bandwidth and therefore faster settling times. It also eliminates errors caused by the changing collector to emitter voltages of bipolar transistors such as the output Darlington pair caused by the Early effect. In addition, the invention also improves the open loop frequency response of the amplifier by reducing the effect of the collector to base capacitances on the output Darlington pair.

Figure 3:
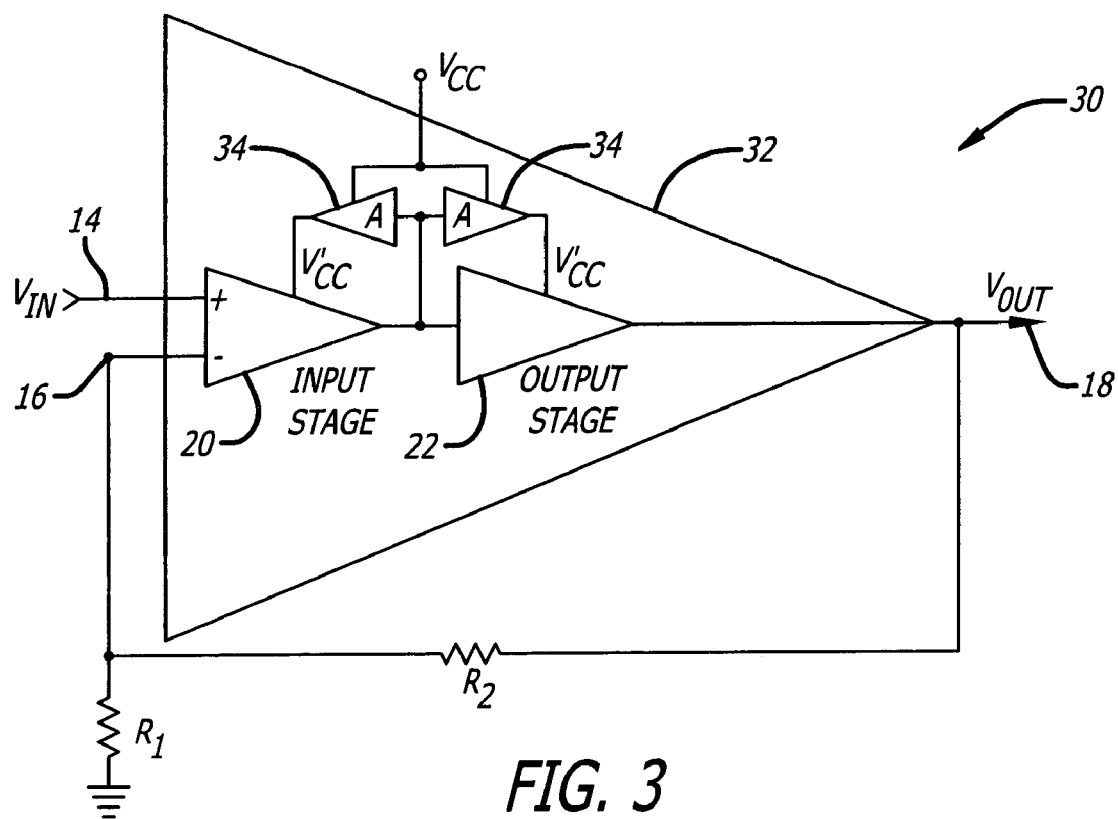
FIG. 3 is a simplified schematic of a closed loop amplifier designed in accordance with an illustrative embodiment of the teachings of the present invention.

FIG. 3 is a simplified block diagram of a closed loop amplifier 30 designed in accordance with an illustrative embodiment of the teachings of the present invention. The amplifier 30 includes a novel op amp 32, which is connected in a feedback configuration with a resistor R2 connected between the negative input terminal 16 and the output terminal 18, a resistor R1 connected between the negative input terminal 16 and ground, an input voltage $V_{IN}$ applied to the positive input terminal 14, and an output voltage $V_O$ output from the output terminal 18.

The op amp 32 includes an input stage 20 adapted to receive and amplify the signals from the positive and negative input terminals 14 and 16, and an output stage 22 adapted to couple the output of the input stage to the output terminal 18. In conventional op amps such as that shown in FIG. 2, the input and output stages 20 and 22 are connected to a DC power supply $V_{CC}$. In accordance with the teachings of the present invention, the input and output stages 20 and 22 are connected to one or more "floating" power supplies (or bootstrapping circuits) 34, which supply power that varies in accordance with the variations in the output (or input) signal. The floating supply circuits 34 bootstrap the transistors in the op amp 32 that are in the signal path, such that the voltages across the transistors are held constant. A DC power supply $V_{CC}$ supplies power to the bootstrapping circuits 34.

As a result of the floating supplies 34, the open loop gain A is increased towards very high values. By bootstrapping all transistors in the signal path, the errors due to the Early effect are eliminated, thereby improving linearity. Bootstrapping also reduces the effects of the collector to base capacitances $C_{CB}$ on the signal path transistors, thereby increasing the bandwidth of the amplifier 30. Key to this invention is the bootstrapping of the PMOS current source M6, allowing the use of smaller geometry devices that have smaller capacitances and therefore wider bandwidth.

Figure 4:
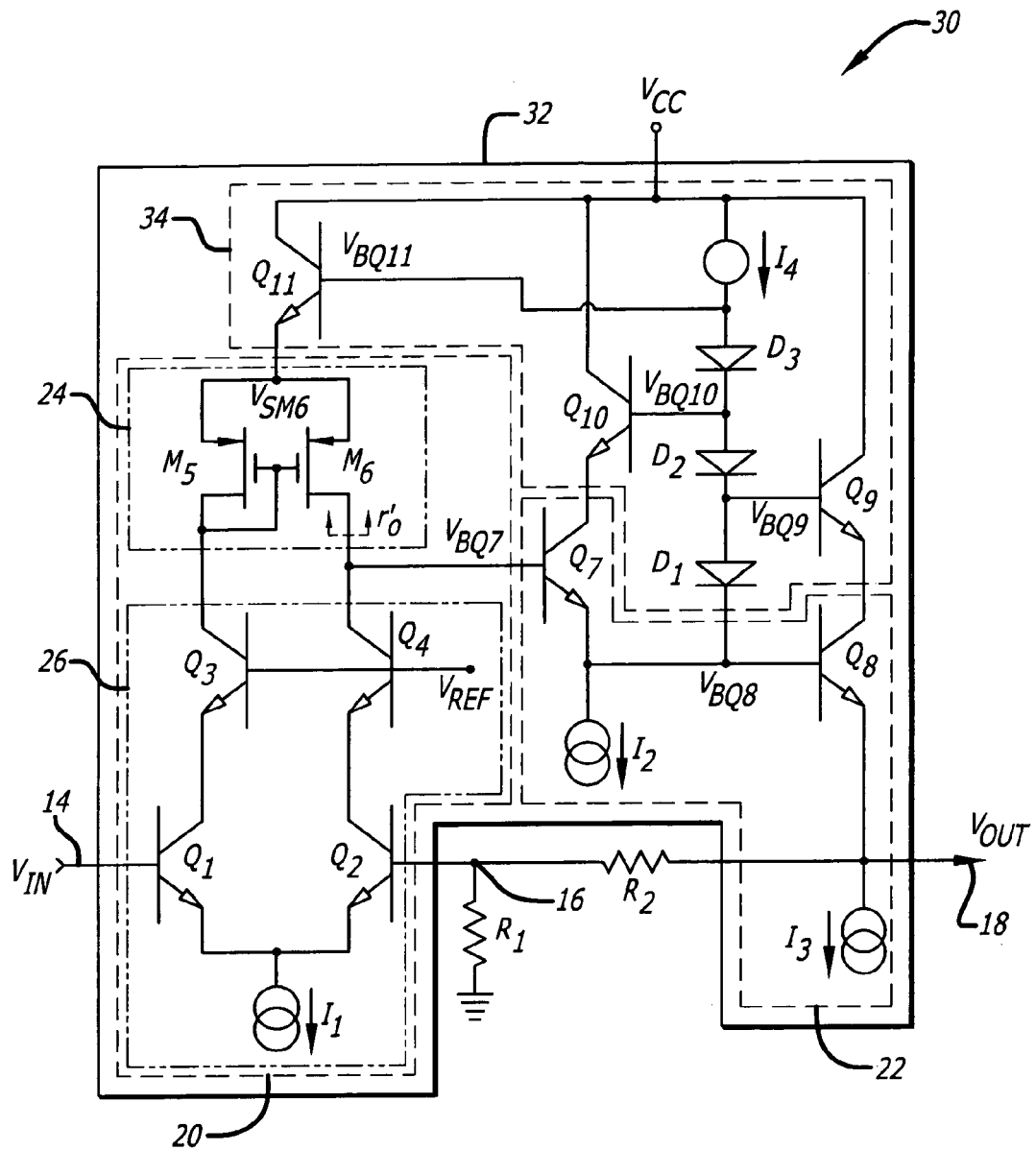
FIG. 4 is a simplified schematic of an implementation of a closed loop amplifier including the internal components of an op amp designed in accordance with an illustrative embodiment of the teachings of the present invention.

FIG. 4 is a simplified schematic of a non-inverting closed loop amplifier 10 including the internal components of an op amp 32 designed in accordance with an illustrative embodiment of the teachings of the present invention. The illustrative amplifier is implemented as a BiCMOS circuit. The invention, however, is not limited thereto. Other process technologies may be used without departing from the scope of the present teachings.

The input stage 20 of the op amp 32 includes a bipolar cascode amplifier 26 with an active load circuit 24. The cascode amplifier 26 includes a differential amplifier Q1 and Q2 having emitters connected in common to a current source I1, bases connected to the positive input terminal 14 and the negative input terminal 16, respectively, and collectors coupled to the emitters of cascode transistors Q3 and Q4, respectively. The bases of Q3 and Q4 are connected in common to a reference voltage $V_{REF}$, and the collectors are connected to the load circuit 24. The load circuit 24 includes two PMOS transistors M5 and M6 connected in a current mirror configuration. The drains of M5 and M6 are connected to the collectors of Q3 and Q4, respectively, and the gates of M5 and M6 are connected in common to the drain of M5. The sources of M5 and M6 are connected in common to the floating power supply 34. The drain of M6 is coupled to the output stage 22.

The output stage 22 includes a Darlington pair Q7 and Q8. The base of Q7 is coupled to the drain of M6, and the emitter of Q7 is coupled to a current source I2. The base of Q8 is coupled to the emitter of Q7, and the emitter of Q8 is coupled to a current source I3. The collectors of Q7 and Q8 are connected to the floating power supply 34. The output terminal 18 is connected to the emitter of Q8.

Recall that one problem with the amplifier of FIG. 2 was that the voltage across M6 varied with the input voltage $V_{IN}$, thereby changing the output impedance $r_O$, which in turn varied the open loop gain A. In accordance with the teachings of the present invention, the floating supply 34 is adapted to regulate the voltage across the current source M6 such that it remains constant. To this end, the floating supply 34 bootstraps the voltage $V_{SM6}$ at the source of M6 to the voltage $V_{BQ7}$ at the drain of M6.

In the illustrative embodiment, the bootstrapping circuit 34 includes an emitter follower Q11 having an emitter coupled to the source of M6, a collector coupled to the DC power supply $V_{CC}$, and a base coupled to a current source I4. Three diodes D1, D2, and D3 are connected in series between the base of Q8 and the base of Q11, to level shift the voltage $V_{BQ8}$ at the base of Q8 to the base of Q11. The cathode of D1 is connected to $V_{BQ8}$, and the anode of D1 is connected to the cathode of D2. The anode of D2 is connected to the cathode of D3, and the anode of D3 is connected to $V_{BQ11}$.

Looking at $V_{BQ7}$ and going around the loop formed by Q7, D1, D2, D3 and Q11 gives:

$$V_{SM6} = V_{BQ7} - V_{BEQ7} + V_{D1} + V_{D2} + V_{D3} - V_{BEQ11} = V_{BQ7} + 0.8 \quad [7]$$

where the voltage across a diode $V_{D1} = V_{D2} = V_{D3} = 0.8$ V and the base to emitter voltage of a transistor $V_{BE} = 0.8$ V. Therefore, the source to drain voltage of M6, $V_{SDM6} = V_{SM6} - V_{DM6} = V_{BQ7} + 0.8 - V_{BQ7} = 0.8$ V, or a constant. Thus, the circuit 34 bootstraps the voltage $V_{BQ7}$ back to the source of M6. This feedback path is very wideband and has a gain α of approximately 0.95. Since the voltage across M6 does not change with $V_{IN}$, the channel length modulation effect has been eliminated.

There is another benefit of this implementation that may not be so obvious. The gain A of the op amp in the prior art was set primarily by the ratio of the output impedance $r_O$ of M6 and the emitter resistance $r_e$ of Q2, where $r_O$ was about $10^5$ Ω. Therefore, the gain A was about 4000. In the op amp 32 of FIG. 4, the output impedance $r_O'$ of M6 with the bootstrap implementation is given by $r_O' = r_O/(1-\alpha)$, where α is the feedback factor of the loop previously described. Bootstrapping therefore increases the output impedance by a factor of $1/(1-\alpha)$. With $\alpha = 0.95$, $r_O'$ is approximately $2 \times 10^6$. This indicates that the gain A of the new op amp 32 would be $r_O'/25$ or $80 \times 10^3$. This large increase in gain will not occur because of the other impedances coming into play, but the amplifier's gain will increase, benefiting both the accuracy and the ability to improve the phase margin when coupled with the other improvements discussed below. Bootstrapping also allows the PMOS device M6 to have a small aspect ratio and a small channel length. This helps the settling time without degrading the loop gain. It also helps the loop gain response by broadening the loop AC response due to the reduction in the parasitic capacitances of M6.

The second problem with the amplifier of FIG. 2 was that the voltages across Q7 and Q8 varied with the input voltage $V_{IN}$, causing Early effect distortions and parasitic collector to base capacitances. In accordance with the teachings of the present invention, the floating supply circuit 34 is also adapted to regulate the voltages across the Q7 and Q8 such that they remain constant. This is accomplished by bootstrapping the collectors of Q7 and Q8 to their respective emitters.

For this purpose, the circuit 34 further includes an emitter follower Q10, having an emitter coupled to the collector of Q7, a collector coupled to $V_{CC}$, and a base connected to the node between diodes D2 and D3; and an emitter follower Q9, having an emitter coupled to the collector of Q8, a collector coupled to $V_{CC}$, and a base connected to the node between diodes D1 and D2.

The voltage at the emitter of Q7 is $V_{EQ7} = V_{BQ7} - 0.8$ V, and the voltage at the collector of Q7 is given by:

$$V_{CQ7} = V_{BQ7} - V_{BEQ7} + V_{D1} + V_{D2} - V_{BEQ10} = V_{BQ7} \quad [8]$$

Therefore, the collector to emitter voltage of Q7 is $V_{CEQ7} = V_{CQ7} - V_{EQ7} = V_{BQ7} - (V_{BQ7} - 0.8) = 0.8$ V, or a constant. Likewise, the collector to emitter voltage of Q8, $V_{CEQ8}$, can be shown to be 0.8 V as well.

Thus, the voltages across Q7 and Q8 no longer vary with $V_{IN}$. This eliminates the Early effect voltages and, more importantly, since the collector and base of Q7 are held to the same voltage, its collector to base capacitance $C_{CB}$ is effectively eliminated. The same can be said for the $C_{CB}$ of Q8. Since these capacitances contributed to the decreasing phase margin of the amplifier, their elimination improves the settling time of the amplifier and the AC response of the loop. These two improvements allow the amplifier to be used in broader band, larger dynamic range applications since the major distortion causes have been eliminated.

The bootstrapping transistors Q9, Q10, and Q11 still suffer the Early effect modulation. However, since they bootstrap Q7, Q8, and the PMOS mirror M5, M6, the collector currents of Q7 and Q8 are fixed. Therefore, the emitter currents of Q9 and Q10 are fixed (as a result of the bootstrap). Now there is a modulation in base current $\Delta I_B$ and collector current $\Delta I_C$ in Q9, Q10, and Q11, and this will have a slight effect on the signal path. This error can be further reduced (and isolated) from the signal path by using a dummy leg to generate the bootstrap signal to drive the $V_{CB}$ of Q7 and Q8, and the $V_{SD}$ of M6.

Note that the illustrative bootstrapping circuit 34 shown in FIG. 4 is an open loop configuration with two feedback elements and one feedforward element. The invention, however, is not limited thereto. Other bootstrapping techniques may be used without departing from the scope of the present teachings.

The following table gives sample values for the components of the op amp 32 implementation shown in FIG. 4:

$V_{CC}$=+5 V
$V_{REF}$=+1 V
I1=3 mA
I2=4 mA
I3=5 mA
I4=0.5 mA
R1=50 Ω
R2=250 Ω

Thus, the present invention has been described herein with reference to a particular embodiment for a particular application. Those having ordinary skill in the art and access to the present teachings will recognize additional modifications, applications and embodiments within the scope thereof.

It is therefore interided by the appended claims to cover any and all such applications, modifications and embodiments within the scope of the present invention.

Accordingly,

What is claimed is:

1. An amplifier comprising:
   a first circuit for receiving and amplifying an input signal, and outputting an output signal, and
   first means for supplying power to said first circuit, wherein said power varies in accordance with variations in said output signal,
   wherein said first circuit includes an input stage with a load circuit,
   wherein said first means includes a bootstrapping circuit adapted to regulate the voltage across said load circuit such that said voltage remains constant,
   wherein said bootstrapping circuit is adapted to detect a first voltage at a first terminal of said load circuit and in accordance therewith apply a second voltage at a second terminal of said load circuit, said bootstrapping circuit including a transistor, and
   wherein said bootstrapping circuit further includes a current source coupled to the base of the transistor.

2. The invention of claim 1 wherein said first circuit includes one or more transistors.

3. The invention of claim 1 wherein the emitter of of the transistor of the bootstrapping circuit is coupled to the second terminal of the load circuit.

4. The invention of claim 1 wherein the base of the transistor of the bootstrapping circuit is coupled to said output signal.

5. The invention of claim 1 wherein said bootstrapping circuit further includes a level shifting circuit adapted to level shift the voltage of said output signal to the base of the transistor of the bootstrapping circuit.

6. The invention of claim 5 wherein said level shifting circuit includes one or more diodes connected in series.

7. The invention of claim 1 wherein the collector of the transistor of the bootstrapping circuit is coupled to a DC power supply.

8. An amplifier comprising:
a first circuit for receiving and amplifying an input signal, and outputting an output signal; and
first means for supplying power to said first circuit, wherein said power varies in accordance with variations in said output signal,
wherein said first circuit includes an input stage with a load circuit, said load circuit includes a first and second transistor connected in a current mirror configuration,
wherein said first means includes a bootstrapping circuit adapted to regulate the voltage across said load circuit such that said voltage remains constant, and
wherein said bootstrapping circuit is adapted to detect a first voltage at a first terminal of said load circuit and in accordance therewith apply a second voltage at a second terminal of said load circuit.

9. The invention of claim 8 wherein the output of said input stage is taken at the drain of the first transistor.

10. The invention of claim 8 wherein said second terminal is the source of the first transistor.

11. The invention of claim 8 wherein said first terminal is the drain of the first transistor.

12. The invention of claim 8 wherein the gates of the first and second transistors are connected in common to the drain of the second transistor.

13. The invention of claim 8 wherein the sources of the first and second transistors are connected together.

14. Am amplifier comprising:
a first circuit for receiving and amplifying an input signal and outputting an output signal, said first circuit including an input stage with a load circuit; and
first means for supplying power to said first circuit, wherein said power varies in accordance with variations in said output signal,
wherein said first means includes a bootstrapping circuit adapted to regulate the voltage across said load circuit such that said voltage remains constant,
wherein said bootstrapping circuit is adapted to detect a first voltage at a first terminal of said load circuit and in accordance with therewith apply a second voltage at a second terminal of said load circuit,
wherein said load circuit includes a first and a second transistor, and
wherein said input stage includes an amplifier stage coupled to said load circuit and adapted to receive and amplify said input signal.

15. The invention of claim 14 wherein said amplifier stage includes a differential pair of transistors.

16. The invention of claim 15 wherein the base of one of the differential pair of transistors is coupled to a positive input terminal and the base of the other one of the differential pair of transistors is coupled to a negative input terminal.

17. The invention of claim 15 wherein the emitters of the differential pair of transistors are connected in common to a current source.

18. The invention of claim 15 wherein said amplifier stage further includes two cascode transistors.

19. The invention of claim 18 wherein the emitter of one of the cascode transistors is coupled to the collector of one of the differential pair of transistors and the emitter of the other cascode transistor is coupled to the collector of the other one of the differential pair of transistors.

20. The invention of claim wherein the bases of the cascode transistors are connected in common to a reference voltage $V_{REF}$.

21. The invention of claim 18 wherein the collector of one of the cascode transistors is coupled to the drain of the first transistor of the load circuit and the collector of the other one of the cascode transistors is coupled to the drain of the second transistor of the load circuit.

22. The invention of claim 1 wherein said first circuit further includes an output stage adapted to couple the output of said input stage to an output terminal.

23. The invention of claim 22 wherein said output stage includes a first transistor.

24. The invention of claim 23 wherein the base of the first transistor of the output stage is coupled to the output of the input stage.

25. An amplifier comprising:
a first circuit for receiving and amplifying an input signal and outputting an output signal, said first circuit includes an input stage with a load circuit; and
first means for supplying power to said first circuit, wherein said power varies in accordance with variations in said output signal,
wherein said first circuit further includes an output stage adapted to couple the output of said input stage to an output terminal, said output stage including a transistor, and
wherein the emitter of the transistor of the output stage is coupled to a current source.

26. An amplifier comprising:
a first circuit for receiving and amplifying an input signal and outputting an output signal, said first circuit includes an input stage with a load circuit; and
first means for supplying power to said first circuit, wherein said power varies in accordance with variations in said output signal,
wherein said first circuit further includes an output stage adapted to couple the output of said input stage to an output terminal, said output stage including a first transistor, and
wherein said first means includes a bootstrapping circuit adapted to regulate the voltage across said first transistor such that said voltage remains constant.

27. The invention of claim 26 wherein said bootstrapping circuit is adapted to detect a voltage at the emitter of the first transistor and in accordance therewith apply a voltage at the collector of the first transistor.

28. The invention of claim 27 wherein said bootstrapping circuit includes a second transistor.

29. The invention of claim 28 wherein the emitter of the second transistor is coupled to the collector of the first transistor.

30. The invention of claim 28 wherein the base of the second transistor is coupled to the emitter of the first transistor.

31. The invention of claim 28 wherein said bootstrapping circuit further includes a level shifting circuit adapted to level shift the voltage at the emitter of the first transistor to the base of the second transistor.

32. The invention of claim 31 wherein said level shifting circuit includes one or more diodes connected in series.

33. The invention of claim 28 wherein the collector of the second transistor is coupled to a DC power supply.

34. The invention of claim 23 wherein said output stage further includes a second transistor.

35. The invention of claim 34 wherein said first and second transistors of the output stage are connected in a Darlington pair configuration.

36. The invention of claim 34 wherein said output terminal is connected to the emitter of the second transistor of the output stage.

37. The invention of claim 34 wherein the base of the second transistor of the output stage is coupled to the emitter of the first transistor of the output stage.

38. The invention of claim 34 wherein the emitter of the second transistor of the output stage is coupled to a current source.

* * * * *